US007042132B2

(12) United States Patent
Bauer et al.

(10) Patent No.: US 7,042,132 B2
(45) Date of Patent: May 9, 2006

(54) TRANSDUCER STRUCTURE THAT OPERATES WITH ACOUSTIC WAVES

(75) Inventors: Thomas Bauer, München (DE); Martin Bünner, München (DE); Andreas Detlefsen, Gerwering (DE); Dietmar Ritter, Stamberg (DE)

(73) Assignee: Epcos AG, Munich (DE)

( * ) Notice: Subject to any disclaimer, the term of this patent is extended or adjusted under 35 U.S.C. 154(b) by 106 days.

(21) Appl. No.: 10/471,987

(22) PCT Filed: Mar. 1, 2002

(86) PCT No.: PCT/DE02/00755

§ 371 (c)(1), (2), (4) Date: Sep. 12, 2003

(87) PCT Pub. No.: WO02/073800

PCT Pub. Date: Sep. 19, 2002

(65) Prior Publication Data

US 2004/0090145 A1 May 13, 2004

(30) Foreign Application Priority Data

Mar. 13, 2001 (DE) ................................ 101 11 959

(51) Int. Cl.
*H01L 41/08* (2006.01)
*H03H 9/145* (2006.01)
*H03H 9/25* (2006.01)

(52) U.S. Cl. ............... 310/313 D; 333/195; 310/313 B

(58) Field of Classification Search ............ 310/313 C, 310/313 D; 333/193–196
See application file for complete search history.

(56) References Cited

U.S. PATENT DOCUMENTS 3,633,132 A * 1/1972 Hartemann ................. 333/154
4,162,465 A * 7/1979 Hunsinger et al. .......... 333/151
4,473,888 A * 9/1984 Smith ..................... 310/313 B
4,516,093 A 5/1985 Nyffeler
4,642,506 A 2/1987 Lewis
5,021,699 A * 6/1991 Dufilie ................... 310/313 B
5,256,927 A * 10/1993 Kato et al. .............. 310/313 B
5,304,965 A * 4/1994 Manner ...................... 333/194
5,568,001 A 10/1996 Davenport .............. 310/313 R

OTHER PUBLICATIONS

Ruppel, "SAW Devices for Spread Spectrum Applications", *Spread Spectrum Techniques and Applications Proceedings*, 1996, IEEE 4th International Symposium on Mainz, Germany, Sep. 22-25, 1996, pp. 713-719.
Wilcox et al, "Acoustic Fields from PVDF Interdigital Transducers", *IEEE Proc.-Sci. Meas. Technol.*, vol. 145, No. 5, Sep. 1998, pp. 250-259.

* cited by examiner

*Primary Examiner*—Darren Schuberg
*Assistant Examiner*—J. Aguirrechea
(74) *Attorney, Agent, or Firm*—Schiff Hardin LLP

(57) ABSTRACT

For improved conformance of a filter operating with acoustic waves, a transducer structure is provided in which the separations between respectively two adjacent electrode fingers of an inter-digital transducer ($IDT_v$) vary over the length of the transducer. The variation thereby preferably follows a continuous distribution function. Reactance filters that are provided with such filters in the serial branch show an improved electrical conformance in the transmission range.

15 Claims, 4 Drawing Sheets

IDTv

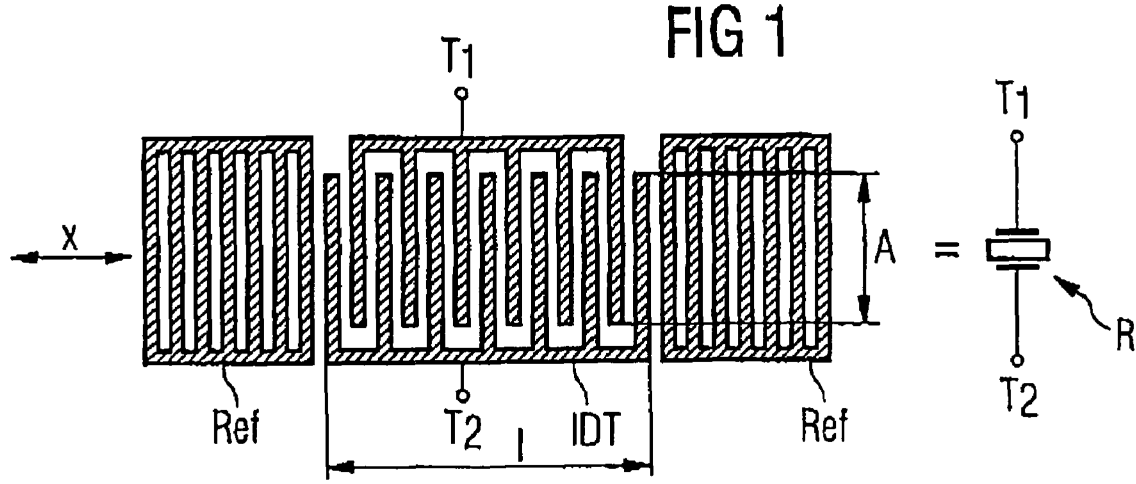
PRIOR ART
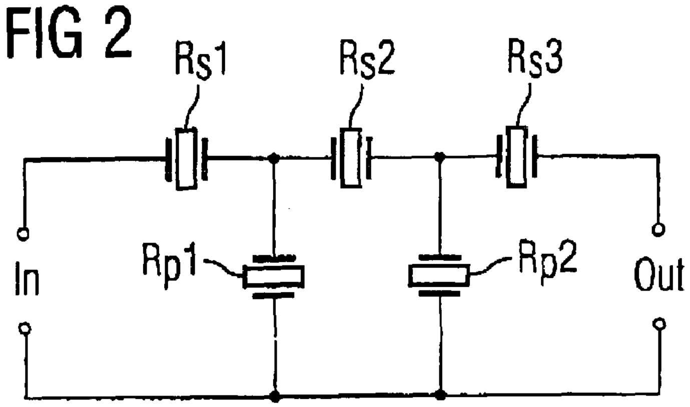
PRIOR ART
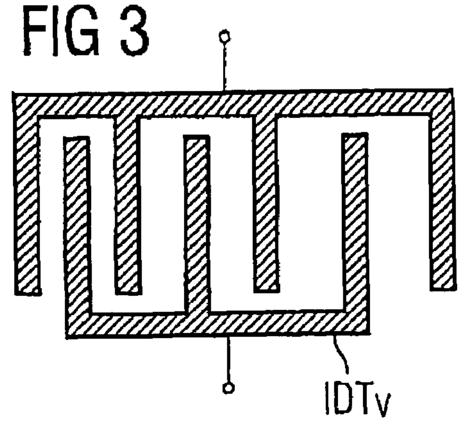

P
Pmax
Pmin
1
N
n

P
Pmax
Pmin
1
Nm
N
n

P
1
N
n

TRANSDUCER STRUCTURE THAT OPERATES WITH ACOUSTIC WAVES

BACKGROUND OF THE INVENTION

The invention concerns a transducer structure operating with acoustic waves, particularly for a surface wave filter (called an OFW or also a SAW filter) or an S-BAR filter (bulk acoustic wave resonator).

In filters operating with acoustic waves (particularly in SAW filters) in particular transducer structures operating with acoustic waves (for example, SAW resonators) are used as impedance elements. Such a resonator is constructed on the surface of a piezoelectric substrate from metallic electrode structures, and comprises an inter-digital transducer with at least two connections that is normally arranged between two reflectors. Known resonators comprise inter-digital transducers that are characterized by a uniform finger period and finger width over the entire transducer. Each resonator thereby exhibits what is known as a resonance frequency and an anti-resonance frequency. The frequency position and the intensity of resonance and anti-resonance can be influenced via variation of the apertures, the finger count and the finger period. The frequency separation between resonance frequency and anti-resonance frequency, as well as its form, remains the same.

In the reactance filter, the resonators are used as impedance elements and switched to an arrangement resembling a ladder (i.e., a ladder type). In addition, resonators are arranged in one serial branch and at least one (preferably, however, a plurality of) parallel branche(s). The resonance frequency of a resonator in the serial branch is set such that it approximately corresponds to the anti-resonance frequency of a resonator in the parallel branch. More complex filters, with a plurality of parallel branches and serially arranged resonators between them, can be constructed from a plurality of basic components (that respectively comprise a parallel and a serial resonator). The interaction of the resonances of the individual resonators generates a desired band-pass behavior of the filter. In addition, the resonance frequencies of the individual resonators, as well as the intensity of the resonances, are suitably set. For this purpose, finger periods, finger counts, and apertures of the individual resonators are the known degrees of freedom.

An ideal filter exhibits a good electrical conformance, a good damping behavior in the filter attenuation band, and as little insertion loss as possible in the transmission range. However, its disadvantage is that these characteristics can mostly not be simultaneously optimized, such that only one suitable combination of characteristics can always be achieved, but not one filter optimal in all characteristics. Particularly in broadband filters that exhibit a relative bandwidth of more than 2%, or in filters that are constructed on substrates with lower electro-acoustic coupling (for example, on $LiTaO_3$ in connection with smaller layer thickness or on quartz), an optimization attempt can only result in non-optimal filters with unsatisfactory characteristics.

SUMMARY OF THE INVENTION

It is the object of the present invention to provide a transducer structure operating with acoustic waves which comprises at least one further degree of freedom in the optimization, and with which, for example, a reactance filter with improved characteristics can be constructed.

This object is achieved by a transducer structure operating with acoustic waves with one or more inter-digital transducers (IDT) arranged between reflectors (Ref), at least one IDT comprising: two interlocking electrode combs having electrode fingers, the finger separations of the IDT, measured between finger centers of each two adjacent electrode fingers, varies over a length of the inter-digital transducer. Advantageous embodiments are described below.

A transducer structure comprises one or more inter-digital transducers arranged between reflectors. These again comprise electrode fingers connected with busbars that interlock like combs. In contrast to known transducers, in the inter-digital transducers of the transducer structures according to the invention, the distance between the finger centers (i.e., the finger period) per two adjacent electrode fingers is not constant; rather it varies over the entire length of the inter-digital transducer.

It has been shown that a better electric conformance can be achieved in a resonator-filter environment with such a variation of the finger period. The filter can be a DMS filter, a TCF filter, or a reactance filter. In particular, the reflection at the input or, respectively, output of the filter can be minimized with a transducer structure with varying finger period. With the invention, for example, the voltage standing wave ratio (VSWR) can be reduced in a reactance filter used in the high-frequency range. Finally, with resonators according to the invention, reactance filters can be constructed that exhibit an improved passband and, in particular, an improved insertion loss.

In an embodiment of the invention, the variation of the finger separations can be undertaken such that the precise values for the finger separations (finger periods) applied over the length of the inter-digital transducer come to lie on a curve corresponding to a continuous function. The precise values for the finger separations at a point x thus correspond to the value of the continuous function scanned at the point x. Preferably, a quasi-continuous function is selected. Such a function exhibits no discontinuities.

In another embodiment, a further advantageous variation of the finger separations is achieved when the cited spreading of the finger separations over the length of the transducer follows a function that is symmetric around an axis perpendicular to the direction of wave propagation, whereby the axis is preferably located in proximity to the center of the transducer. A function is preferably selected that exhibits a maximum at the axis of reflection.

A simple variation of the finger separations over the length of the inter-digital transducer follows a linear function in which the finger separations linearly increase or, respectively, decrease in a direction. The spreading of the finger separations can be such that the increase ensues from one end to the other end of the inter-digital transducer, or that the increase or decrease ensues up to the axis of reflection and thereafter once again decreases or, respectively, increases.

It is additionally possible in an embodiment to spread the finger separations over the length of the inter-digital transducer according to a nonlinear function, for example, according to a parabolic function. This can also be selected such that it reaches an extreme value in the middle of the transducer that represents either a minimum or a maximum.

The finger separations may be varied around an average value up to a maximum of +/−2.5%, such that a maximal difference of 5% results between two finger separations. Typically, inter-digital transducers according to the invention exhibit a maximum difference of 2 to 3%, for example of 3%. Advantageous improvements are thereby already achieved in reactance filters with smaller differences than, for example, DMS filters. The latter can fully utilize the stated variation width and exhibit a difference up to 5%.

A further variation possibility of an embodiment of the inventive resonator arises via an additional variation of the finger widths of the electrode fingers viewed over the length of the inter-digital transducer. This variation also preferably follows a continuous function. The variation of the finger widths can be undertaken such that the metallization proportion remains constant over the length of the transducer. However, other variations are also possible in which the metallization proportion over the length of the transducer continually increases or decreases, or in that the metallization proportion follows the corresponding distribution function of the finger separations, as the case may be, a function reflected in the center of the transducer.

An embodiment of the inventive resonator develops with particular advantages in a reactance filter, in which it is arranged either in a parallel branch or, preferably, a serial branch. Since the form of the resonance of the resonators is changed with the inventive variation of finger widths and/or metallization proportion, particularly the passband is influenced. Since this is substantially determined via the resonators arranged in the serial branch, a maximum result is achieved with inventive resonators in the serial branch. In this manner, the electrical characteristics of the reactance filter can be changed and optimized.

With an embodiment of the invention, a spreading of the resonance can be achieved for the individual resonator, whereby simultaneously the shape of the anti-resonance remains unchanged. In this manner, a reactance filter can be achieved which exhibits an increased bandwidth without the other characteristics of the filter simultaneously deteriorating. With an embodiment of the invention, reactance filters may be achieved via suitable selected variations of the finger separations and finger widths that, given the same bandwidth, overall show an improved electrical conformance in the transmission range of the filter.

A reactance filter with an individual inventive resonator in the serial branch already shows an improved electrical behavior. However, all resonators arranged in the serial branch are preferably provided with inventively varying finger separations and/or varying finger widths. In embodiments of the invention, the variation widths of the finger separations can thereby fluctuate between 0.1 and 3% around the median finger separation. In this manner, reactance filters are achieved that exhibit an increased relative bandwidth of more than 2%.

Particularly advantageous are inventive resonators or, respectively, filters produced from them, constructed with poorer electro-acoustic coupling, for example, on lithium tantalate with low layer thickness. Under such conditions, a better electrical conformance is achieved via an improved electro-acoustic behavior.

DESCRIPTION OF THE DRAWINGS

The invention is more closely explained with reference to the embodiments illustrated in the following figures.

FIG. 1 is a pictorial/schematic diagram showing a known resonator;

FIG. 2 is a schematic diagram showing a known structure for a reactance filter;

FIG. 3 is a pictorial diagram showing an embodiment of the inventive resonator;

DETAILED DESCRIPTION OF THE PREFERRED EMBODIMENTS

Figure 4:
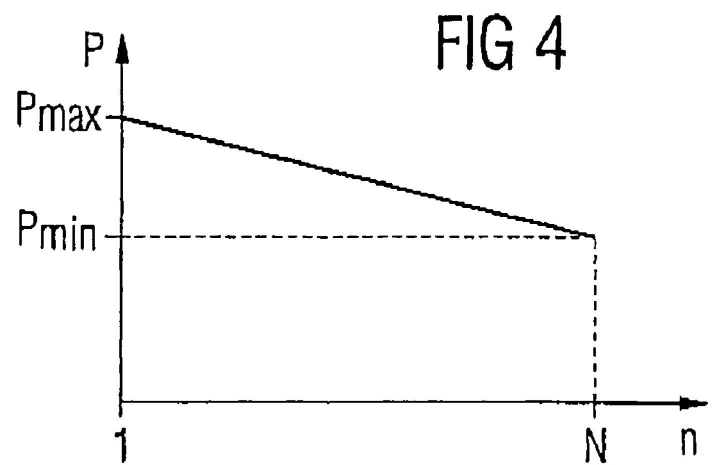
FIGS. 4–6 are graphs showing inventive functions for spreading of the finger widths over the length of the transducer.

A resonator operating with acoustic waves in shown in FIG. 1. The metallic electrode structures (for example, comprising aluminum, an aluminum alloy, or a multi-layer structure comprising an aluminum layer) are applied to a piezoelectric substrate. The resonator consists of an inter-digital transducer IDT that is arranged between two reflectors Ref. Each inter-digital transducer IDT comprises of two telescoped comb-like electrodes that are connected with connections T1 and T2. The electrode fingers of the inter-digital transducer of known resonators exhibit a uniform electrode finger separation P that typically is defined as the distance between the finger centers of two adjacent electrode fingers. The circuit symbol for such a resonator R is shown in the right half of the image. Known possibilities to adjust the electrical properties of such a resonator R exist in the variation of the aperture A, the number N of the electrode fingers, the finger separation P of the electrode fingers, and the metallization proportion $\eta$ which, viewed in the direction of wave propagation, defines the proportion of the metallized surface to the entire surface.

FIG. 2 shows an example for a reactance filter that is arranged in the form of a branch switch or, respectively, a ladder-type structure. This comprises a serial branch, in which serial resonators $R_s$ are arranged, between an input IN and an output OUT. Beside this, two parallel branches are shown in the figure in which, respectively, one parallel resonator $R_p$ is arranged. Typically, the parallel branch is connected to ground. However, it is also possible to symmetrically operate reactance filters. The resonators feature an impedance behavior which, given a resonance frequency, exhibit a minimal impedance; however, given an anti-resonance frequency, they exhibit a maximal impedance. Via suitable modulation of the resonance frequencies and anti-resonance frequencies of the resonators in the serial and in the parallel branches, the reactance filter fashions a passband.

FIG. 3 shows an embodiment of the inventive inter-digital transducer $IDT_v$ with finger separation varying over the length of the inter-digital transducer. The spreading of the finger separations over the length of the transducer thereby follows a function, as it is specified in FIG. 4, for example. In an inventive transducer, the finger separations P spread over the number of fingers n lie on a preferably continuous function (in FIG. 4, for example, on a linear function). The finger separation P thereby falls over the length of the transducer from a maximum finger separation Pmax, culminating at a minimal finger separation Pmin. However, spreadings of the finger separations are also possible as they are shown in FIGS. 5 and 6, for example. In FIG. 5, a linear spreading over the length of the transducer is likewise shown, whereby the overall distribution function is composed of two linear sub-functions that are arranged symmetric to one another in terms of an axis of reflection lying in the region of a median electrode finger Nm and vertical to the direction of wave propagation X.

Figure 9:
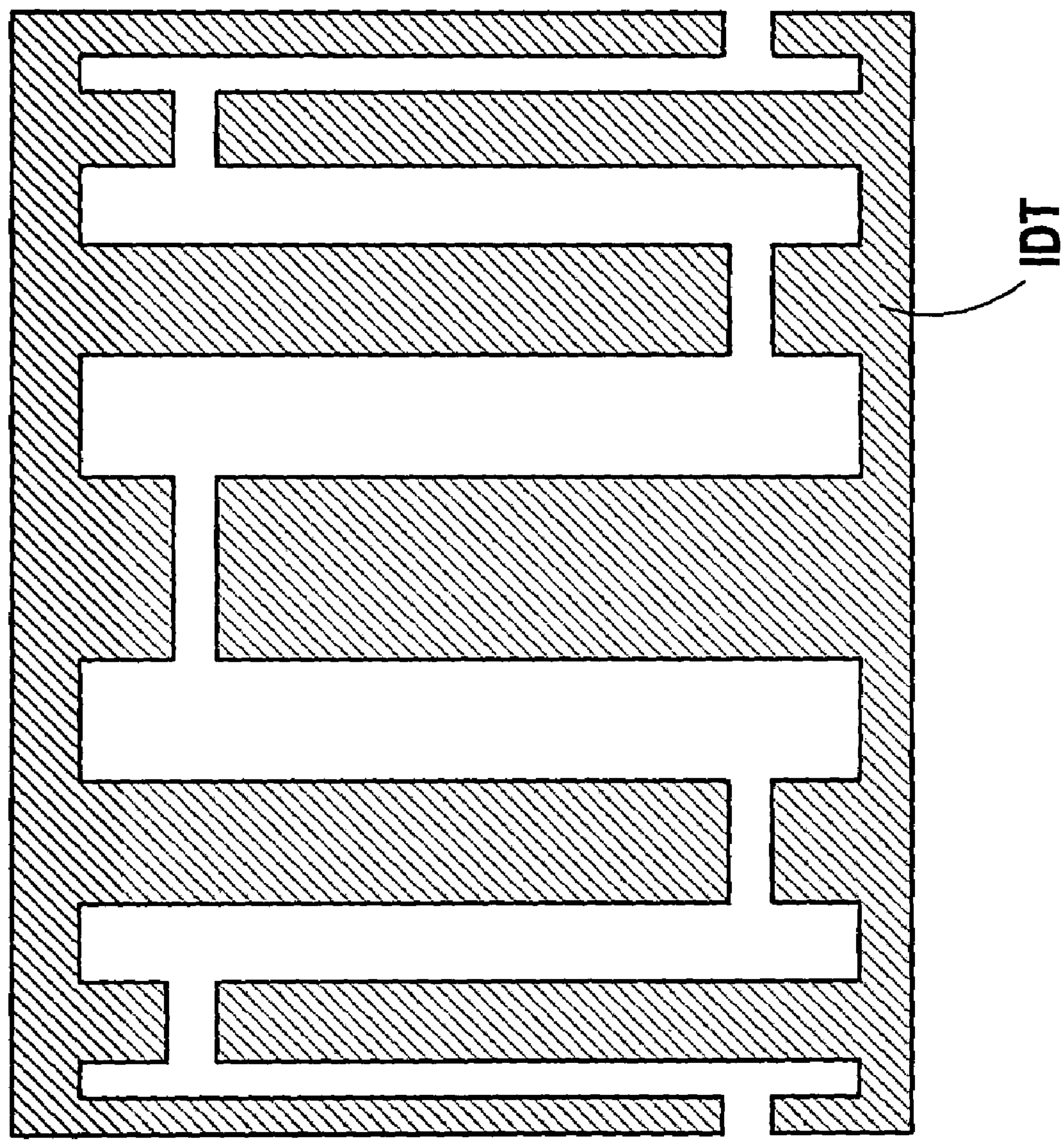
FIG. 9 is a pictorial diagram illustrating an IDT having varying distance and width of electrode fingers over the length of the IDT.

As noted above, and as illustrated by FIG. 9, further variation according to an embodiment of the inventive resonator arises via an additional variation of the finger widths of the electrode fingers viewed over the length of the inter-digital transducer. This variation also preferably follows a continuous function. The variation of the finger widths can be undertaken such that the metallization proportion remains constant over the length of the transducer. However, other variations are also possible in which the metallization proportion over the length of the transducer continually increases or decreases, or in that the metallization proportion follows the corresponding distribution function of the finger separations, as the case may be, a function reflected in the center of the transducer.

FIG. 6 shows a spreading of the finger separations P that corresponds to a parabolic function whose maximum is placed here in the region of the transducer center.

Figure 5:
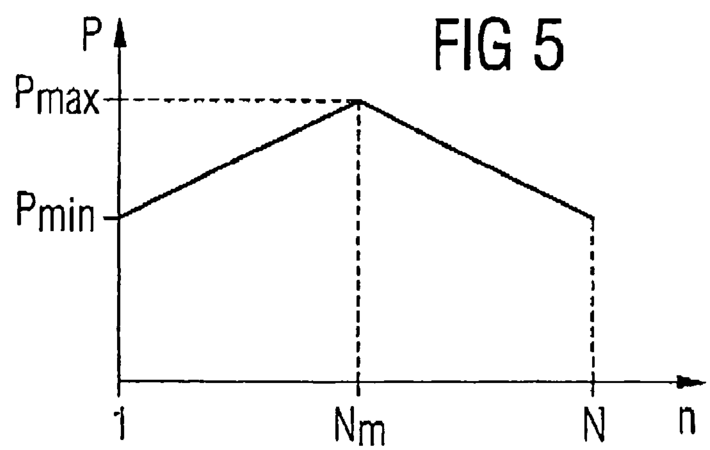
Figure 6:
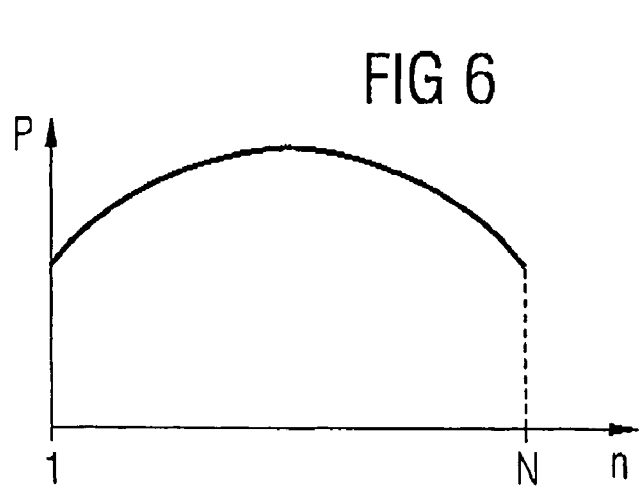

In addition to the spreadings of the finger separations shown in FIGS. 4 through 6, further functions are possible and advantageous that lead to an inventive resonator that yields improved characteristics for reactance filters manufactured therefrom. It is not required that the distribution function show a symmetry behavior as shown. However, with regard to losses, it is mostly advantageous that the finger separation continually changes, that the distribution function thus exhibits no discontinuities.

As an exemplary embodiment, an inventive resonator which comprises an inter-digital transducer $IDT_v$ with linear varying finger separation (as shown in FIG. 3) is used for production of a reactance filter. In addition, resonators as shown in FIG. 2 are interconnected to a reactance filter. The serial resonators $R_s$1 through $R_s$3 are fashioned via inventive resonators, while the parallel resonators are conventional resonators (for example, as shown in FIG. 1).

A suitable application for the invention arises, for example, in a 2-in-1 filter used for mobile telephones, in which a 1 GHz reactance filter and a 2 GHz reactance filter are combined on a single substrate with a uniform metallization layer thickness of, for example, 230 nm. The layer thickness of 230 nm is approximately 40% less than an optimal and typical metallization layer thickness used in 1 GHz filters. This leads, in the 1 GHz filter, to a clear degradation of the electrical conformance, as a consequence of which an in increased signal reflection arises at the filter input and output. This manifests in a voltage standing wave ratio VSWR of approximately 3.6, which in turn requires a correspondingly high damping of the transmitted signal in the transmission range. This unnecessarily high insertion loss generates losses whose avoidance is sought.

Figure 7:
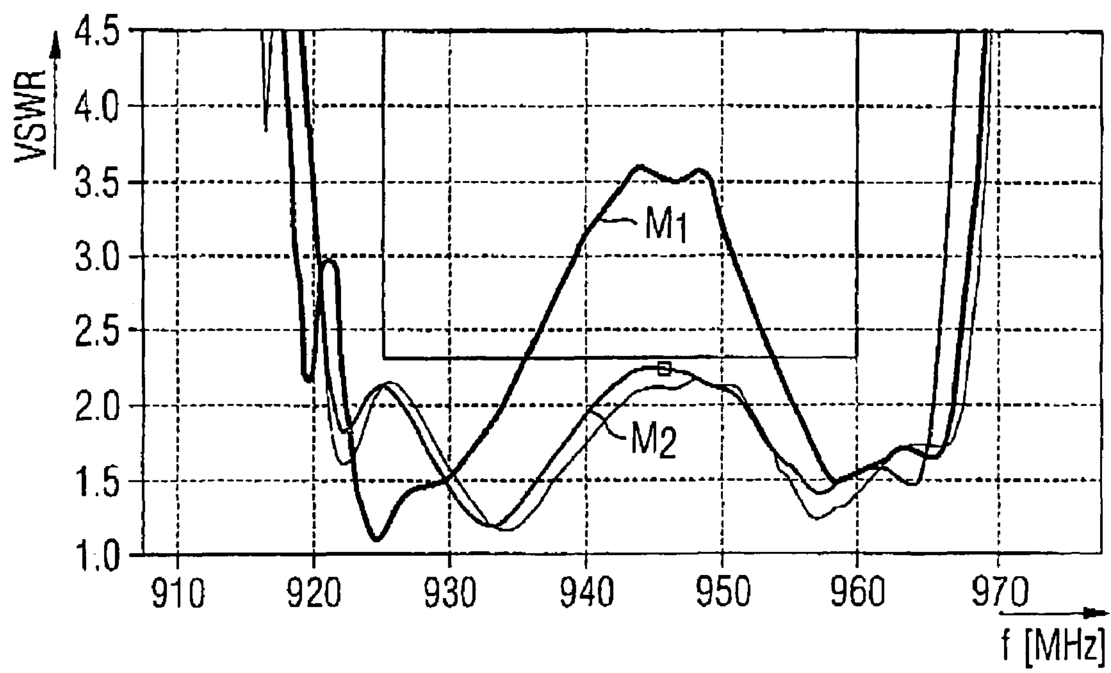
FIG. 7 is a graph comparing the voltage standing wave ratio of the known and inventive reactance filters.

In FIG. 7, the gradient M2 for the voltage standing wave ratio VSWR of the specified inventive reactance filter is shown, which is contrasted to the gradient M1 of a corresponding reactance filter with conventional resonators. The gradient M1 of the reactance filter constructed with known resonators shows a maximum voltage standing wave ratio of approximately 3.6 in the transmission range, which is indicated in the upper region of the figure by a rectangle. The reactance filter provided with inventive resonators in the serial branch in contrast produces the gradient M2, which shows a clearly improved voltage standing wave ratio of approximately 2.3.

Figure 8:
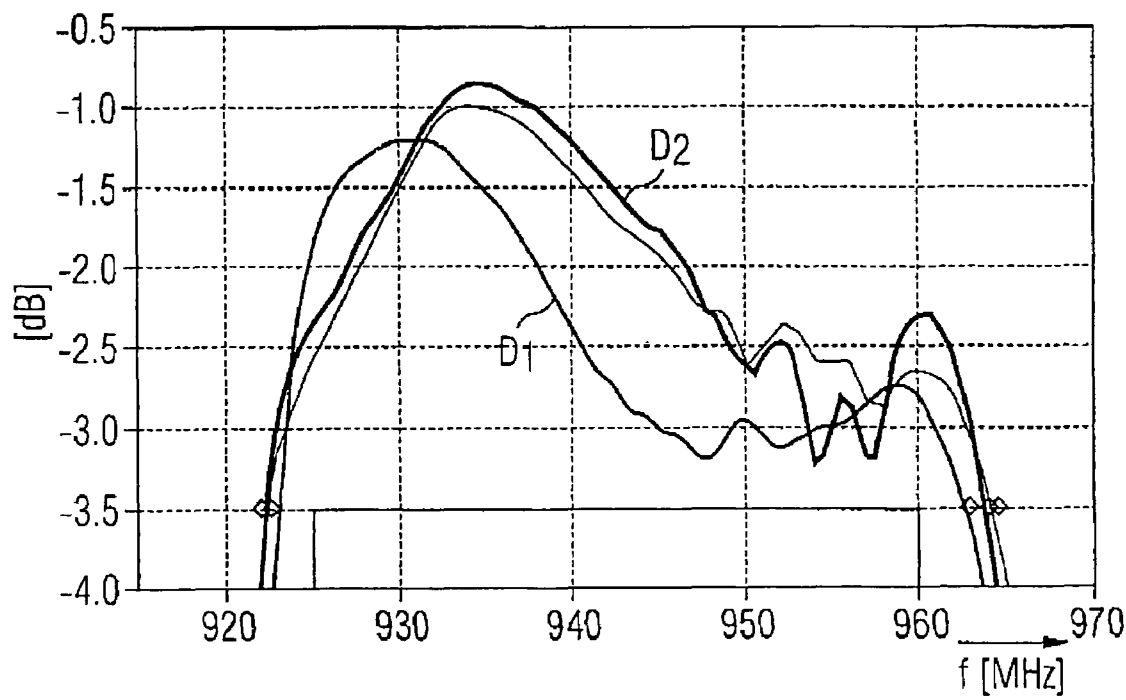
FIG. 8 is a graph comparing the transmission range of an inventive reactance filter with that of a known reactance filter.

The shown transmission behavior likewise determined via a comparison measurement using the function S21 is reproduced in FIG. 8. The curve D1 for the damping of the known reactance filter runs below the curve D2 for the damping behavior of the inventive reactance filter over almost the entire passband. It thus shows that the electrical conformance can be substantially improved with the invention, which in particular shows in the presented lower insertion loss of the inventive reactance filter.

In an embodiment for further improvement of inventive reactance filters, the metallization proportion can additionally be still set such that it is constant over the transducer, or varies corresponding to a distribution function. An optimal distribution function for the finger separations can be determined with the aid of an automatic optimization that can be implemented with software developed on the basis of electro-acoustic models. In each case, the invention shows a simple way to improve in a simple manner a poorly adapting filter, whereby previously required additional adapting elements can be dispensed with.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art. The particular implementations shown and described herein are illustrative examples of the invention and are not intended to otherwise limit the scope of the invention in any way. For the sake of brevity, conventional electronics and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

The invention claimed is:

1. A reflector-based resonator structure operating with acoustic waves with one or more inter-digital transducers (IDT) arranged between reflectors (Ref), at least one IDT comprising:

two interlocking electrode combs having electrode fingers, the finger separations of the IDT, measured between finger centers of each two adjacent electrode fingers, varies over a length of the inter-digital transducer according to a continuous function and wherein a difference between the separations of adjacent electrode fingers amounts to a maximum of 5% viewed over the total length of the IDT.

2. The resonator structure according to claim 1, wherein the variation of the finger separations corresponds to a function that, in proximity to a center, is symmetric around an axis perpendicular to a direction of wave propagation.

3. The resonator structure according to claim 1, wherein a spreading of the finger separations over the length of the IDT is conformed to a linear function.

4. The resonator structure according to claim 1, wherein a spreading of the finger separations over the length of the IDT is conformed to a parabolic function.

5. The resonator transducer structure according to claim 1, wherein the difference amounts to a maximum of 2–3%.

6. The resonator structure according to claim 1, wherein additionally widths of the electrode fingers vary over the length of the IDT, and their separation is conformed to a continuous function.

7. The resonator structure according to claim 1, wherein the finger separations are spread over the length of the IDT such that the finger separations in the center of the transducer are the largest.

8. The resonator structure according to claim 1, wherein the IDT is arranged in a reactance filter which comprises a serial and at least one parallel branch, in which respectively at least one resonator is arranged.

9. The resonator structure according to claim 8, wherein the IDT is arranged in the serial branch of the reactance filter.

10. The resonator structure according to claim 9, wherein electrode fingers of all resonators arranged in the serial branch exhibit at least one of varying finger separations and varying finger widths.

11. The resonator structure according to claim 1, wherein the variation widths of the finger separations, with regards to an average finger separation, amount to +/−0.1% to 2.5%.

12. A reactance filter comprising a resonator structure according to claim 1, the reactance filter having a large relative bandwidth delta $f_{rel}$, in that 2%<delta $f_{rel}$<5% is valid.

13. A filter on a lithium tantalate (LT) substrate or on a substrate having a poorer electro-acoustic coupling than LT comprising a resonator structure according to claim 1.

14. The resonator structure according to claim 1, wherein the variance according to a continuous function ensues over an entire length of the IDT.

15. The resonator structure according to claim 14, wherein the distance between any two adjacent pairs of fingers of the IDT is not equal.

* * * * *